United States Patent
Liu

(10) Patent No.: US 10,338,428 B2
(45) Date of Patent: Jul. 2, 2019

(54) QUANTUM DOT DISPLAY APPARATUS AND MANUFACTURING METHOD THEREOF

(71) Applicant: Shenzhen China Star Optoelectronics Technology Co., Ltd., Shenzhen (CN)

(72) Inventor: Guohe Liu, Shenzhen (CN)

(73) Assignee: SHENZHEN CHINA STAR OPTOELECTRONICS TECHNOLOGY CO., LTD., Shenzhen, Guangdong (CN)

(*) Notice: Subject to any disclaimer, the term of this patent is extended or adjusted under 35 U.S.C. 154(b) by 574 days.

(21) Appl. No.: 14/917,274

(22) PCT Filed: Dec. 21, 2015

(86) PCT No.: PCT/CN2015/098145
§ 371 (c)(1),
(2) Date: Mar. 8, 2016

(87) PCT Pub. No.: WO2017/049786
PCT Pub. Date: Mar. 30, 2017

(65) Prior Publication Data
US 2017/0255056 A1    Sep. 7, 2017

(30) Foreign Application Priority Data

Sep. 24, 2015 (CN) .......................... 2015 1 0615542

(51) Int. Cl.
*G02F 1/1335* (2006.01)
*G02F 1/1337* (2006.01)
(Continued)

(52) U.S. Cl.
CPC ....... *G02F 1/133514* (2013.01); *G02B 5/201* (2013.01); *G02F 1/1337* (2013.01);
(Continued)

(58) Field of Classification Search
CPC ......... G02F 1/133514; G02F 1/133621; G02F 1/133528; G02F 1/1337; G02F 1/133617;
(Continued)

(56) References Cited

U.S. PATENT DOCUMENTS

2014/0192294 A1* 7/2014 Chen .......................... F21V 9/08
349/69
2014/0204319 A1* 7/2014 Cai .................... G02F 1/133514
349/106
(Continued)

FOREIGN PATENT DOCUMENTS

CN      104377226 A      2/2015
CN      104460103 A   *  3/2015  ........... G02F 1/1335
(Continued)

*Primary Examiner* — Eli D. Strah
(74) *Attorney, Agent, or Firm* — Leong C. Lei

(57) ABSTRACT

The present disclosure provides a quantum dot display apparatus. By adding quantum dot display technology of the present disclosure can provide sophisticated quantum dot patterns in the color filter layer and have higher resolution, color saturation and color gamut of the display apparatus, the well structure and manufacture is simple. The disclosure also provides a manufacturing method of a quantum dot display apparatus, the methods includes exposure, coating, developing process of the existing color filter to contain the surface modified red and green quantum dot resin composition with more sophisticated patterns, and making high resolution, color saturation and color gamut quantum dot display apparatus, the material preparation and fabrication process of this manufacturing method is simple, less waste of materials, low production cost, suitable for mass production.

3 Claims, 6 Drawing Sheets

(51) Int. Cl.
*G02B 5/20* (2006.01)
*H01L 27/146* (2006.01)
*H01L 27/32* (2006.01)

(52) U.S. Cl.
CPC .. *G02F 1/133512* (2013.01); *G02F 1/133528* (2013.01); *G02F 1/133617* (2013.01); *G02F 1/133621* (2013.01); *B32B 2457/202* (2013.01); *G02B 5/206* (2013.01); *G02B 5/207* (2013.01); *G02F 1/133516* (2013.01); *G02F 2001/133519* (2013.01); *G02F 2001/133567* (2013.01); *G02F 2001/133614* (2013.01); *G02F 2201/50* (2013.01); *G02F 2202/10* (2013.01); *G02F 2202/36* (2013.01); *H01L 27/14621* (2013.01); *H01L 27/322* (2013.01); *Y10T 428/10* (2015.01); *Y10T 428/105* (2015.01); *Y10T 428/1036* (2015.01)

(58) Field of Classification Search
CPC ......... G02F 1/133512; G02F 1/133516; G02F 2001/133519; G02F 2001/133567; G02F 2001/133614; G02F 2202/36; G02F 2202/10; G02F 2201/50; G02B 5/201; G02B 5/206; G02B 5/207; H01L 27/322; H01L 27/14621; Y10T 428/10; Y10T 428/105; Y10T 428/1036; B32B 2457/202
See application file for complete search history.

(56) References Cited

U.S. PATENT DOCUMENTS

| | | | | |
|---|---|---|---|---|
| 2015/0301408 | A1* | 10/2015 | Li | G02F 1/133621 362/84 |
| 2016/0033823 | A1* | 2/2016 | Lee | G02F 1/133617 349/71 |
| 2016/0178960 | A1* | 6/2016 | Kim | G02F 1/133617 362/293 |

FOREIGN PATENT DOCUMENTS

| | | | |
|---|---|---|---|
| CN | 104460103 A | 3/2015 | |
| WO | WO-2014190604 A1 * | 12/2014 | G02F 1/133621 |

* cited by examiner

# QUANTUM DOT DISPLAY APPARATUS AND MANUFACTURING METHOD THEREOF

FIELD OF THE INVENTION

The Related Arts The present invention relates to the field of displaying techniques, and in particular to a quantum dot display apparatus and manufacturing method thereof.

BACKGROUND OF THE INVENTION

The liquid crystal display, LCD has many advantages of thin, energy saving, no radiation, etc., and has been widely used such as: LCD TV, mobile phone, personal digital assistant, PDA, digital camera, computer screen or laptop screens, flat panel display field dominant. The principle of operation of the liquid crystal display is filling liquid crystal molecules between a thin film transistor array substrate, TFT Array Substrate and a color filter substrate, CF Substrate, and a driving voltage is applied to the two substrates to control the rotational direction of liquid crystal molecules to refract light from the backlight module and generates frame.

With the continuous development of display technology, the quality requirements to the display are also more and more increased. The quantum dots, QDs is usually composed of II-VI, spherical semiconductor nanoparticles or III-V elements, particle size is generally between a few nanometers to tens of nanometers. The quantum dots due to quantum the confinement effect exists, the original continuous band discrete into energy level structure, which can emit visible light by the external excitation. The quantum dot materials due to its emission peak with smaller full width at half maximum, FWHM and light colors can be adjusted by quantum dots size, structure or composition of simple adjustment, therefore, its application in display device it can effectively improve the color saturation and color gamut.

When making a quantum dot pattern in the conventional quantum dot display, the quantum dot material is generally mixed with green, blue and red color resist correspondingly first, then exposing, the pattern containing quantum dots is formed, and then continue to produce the rear polarizing layer, alignment layer and form the color filter substrate, and the color filter substrate is fixed to the array substrate to form a quantum dot display apparatus. But this method requires mixing the red, green, blue quantum dots, respectively to the red, green and blue color resist, the process is more complicated, and to evenly disperse the quantum dots in color photoresist is also difficult. In addition to the above methods, but also through the transfer printing, screen printing and other methods to produce a quantum dot pattern, but the material waste, poor process reproducibility and the obtained quantum dot pattern fineness is poor, it is difficult to obtain a large size, high-resolution display device.

SUMMARY OF THE INVENTION

The purpose of the present disclosure is to provide a quantum dot display apparatus with sophisticated quantum dot patterns and have higher resolution, color saturation and color gamut of the display apparatus.

The purpose of the present disclosure is to provide a manufacturing method of a quantum dot display apparatus with sophisticated quantum dot patterns, the material preparation and fabrication process of this manufacturing method is simple, less waste of materials, low production cost, suitable for mass production.

In order to realize the purposes mentioned above, a quantum dot display apparatus, including: a color filter substrate, an array substrate formed opposite to the color filter substrate, a blue light backlight module formed below the color filter substrate, and a liquid crystal layer formed between the color filter substrate and the array substrate;

wherein the color filter substrate further including: a lower substrate, a color filter layer and a black matrix formed on the lower substrate, a rear polarizer layer formed on the color filter layer and a lower alignment layer formed on the rear polarizer layer;

wherein the color filter layer including a plurality of sub-pixel region arranged in an array form, and the plurality of sub-pixel regions spaced apart by the black matrix, the sub-pixel regions include: red sub-pixel regions, green sub-pixel regions, and blue sub-pixel regions;

wherein the red sub-pixel region including a first quantum dot resin composition layer provided on the lower substrate and a red photoresist layer provided on the first quantum dot red resin composition layer; the green sub-pixel region including a second quantum dot resin composition layer provided on the lower substrate and a green photoresist layer provided on the second quantum dot resin composition layer; and a transparent organic photoresist is filled in the blue sub-pixel region and between the each of the sub-pixel region as the role of a flat layer and a protective layer.

Wherein the array substrate including: an upper substrate, an upper alignment layers formed in the upper substrate of the surface faced to the lower substrate, and an upper polarizer layer formed on the upper substrate wherein the upper polarizer layer is provided on the surface faced to the lower substrate, or provided between the upper substrate and the alignment layer.

Wherein the first and the second quantum dot resin composition layer is obtained after curing the quantum dot resin composition and the quantum dot resin composition including surface modified red quantum dots, surface modified green quantum dots, alkali-soluble resins, solvents and dispersants.

Wherein the material of the surface modified red quantum dots, surface modified green quantum dots including one or more than one material selected from the material of the II-VI family of semiconductor nano-materials III-V family of semiconductor nano-materials, and IV-VI family of semiconductor nano-materials;

the alkali-soluble resin including styrene-maleic anhydride copolymer or aromatic acid (meth) acrylate half ester;

the solvent including one or more than one material selected from the material of formic acid, acetic acid, chloroform, acetone, butanone, fatty alcohols, ethylene glycol monomethyl ether, ethylene glycol monomethyl ether, ethylene glycol monomethyl ether, ethylene glycol monomethyl ether, diethylene glycol diethyl ether, ethyl acetate, methyl ethyl ketone, methyl isobutyl ketone, ethylene glycol monomethyl ether, γ-butyrolactone, 3-ether acetate propionate, butyl carbitol, butyl carbitol, acetate, propylene glycol monomethyl ether, propylene glycol monomethyl ether acetate, cyclohexane, xylene, and isopropyl alcohol; and the dispersant may be selected from amide-based polymer, modified polyurethane, modified polyacrylate, and silicone surfactant.

Wherein the thickness of the first and the second quantum dot resin composition layer is 1 μm-200 μm.

A manufacturing method of a quantum dot display apparatus is also present in the disclosure, including the following steps:

Step 1: a lower substrate is provided, and a black matrix is formed on the lower substrate;

Step 2: a quantum dot resin composition is coated on the lower substrate between the black matrix, pre-baking the lower substrate coated with the quantum dot resin composition to remove the organic solvent in the quantum dot resin composition;

Step 3: a red photoresist is applied on the quantum dot resin composition and the black matrix, the excess red photoresist and the quantum dot resin composition are removed by prebaking, exposing, and developing processes to bake and form the red sub-pixel region including the red photoresist layer and the first quantum dot resin composition layer disposed below the red photoresist layer;

Step 4: the quantum dot resin composition is further coated between the black matrix on the lower substrate, pre-baking the lower substrate coated with the quantum dot resin composition to remove the organic solvent in the quantum dot resin composition;

Step 5: a green photoresist is applied on the quantum dot resin composition and the black matrix, the excess green photoresist and the quantum dot resin composition are removed by prebaking, exposing, and developing processes to bake and form the green sub-pixel region including the green photoresist layer and the second quantum dot resin composition layer disposed below the green photoresist layer;

Step 6: a transparent organic photoresist is coated on the lower substrate and the black matrix to form the blue sub-pixel region, thus forming a color filter layer;

Step 7: a rear polarizing layer is set on the color filter layer, a lower alignment layer is formed on the polarizing layer, to finish the formation of a color filter substrate; and Step 8: an array substrate is provided, and the color filter substrate and the array substrate are paired, a liquid crystal is filled to form the liquid crystal layer, a blue light backlight module is disposed in a bottom of the color filter substrate to produce the quantum dot display apparatus.

wherein the array substrate including: an upper substrate, an upper alignment layers formed in the upper substrate of the surface faced to the lower substrate, and an upper polarizer layer formed on the upper substrate wherein the upper polarizer layer is provided on the surface faced to the lower substrate, or provided between the upper substrate and the alignment layer.

Wherein in the steps 2 and 4, the quantum dot resin composition including surface modified red quantum dots, surface modified green quantum dots, alkali-soluble resins, solvents and dispersants.

Wherein the material of the surface modified red quantum dots, surface modified green quantum dots including one or more than one material selected from the material of the II-VI family of semiconductor nano-materials III-V family of semiconductor nano-materials, and IV-VI family of semiconductor nano-materials;

the alkali-soluble resin including styrene-maleic anhydride copolymer or aromatic acid (meth) acrylate half ester;

the solvent including one or more than one material selected from the material of formic acid, acetic acid, chloroform, acetone, butanone, fatty alcohols, ethylene glycol monomethyl ether, ethylene glycol monomethyl ether, ethylene glycol monomethyl ether, ethylene glycol monomethyl ether, diethylene glycol diethyl ether, ethyl acetate, methyl ethyl ketone, methyl isobutyl ketone, ethylene glycol monomethyl ether, γ-butyrolactone, 3-ether acetate propionate, butyl carbitol, butyl carbitol, acetate, propylene glycol monomethyl ether, propylene glycol monomethyl ether acetate, cyclohexane, xylene, and isopropyl alcohol; and the dispersant may be selected from amide-based polymer, modified polyurethane, modified polyacrylate, and silicone surfactant.

Wherein in the steps 2 and 4 the thickness of the first and the second quantum dot resin composition layer is 1 μm-200 μm and the prebaking temperature is 100° C.-150° C.

A quantum dot display apparatus is also present in the disclosure, including: a color filter substrate, an array substrate formed opposite to the color filter substrate, a blue light backlight module formed below the color filter substrate, and a liquid crystal layer formed between the color filter substrate and the array substrate;

wherein the color filter substrate further including: a lower substrate, a color filter layer and a black matrix formed on the lower substrate, a rear polarizer layer formed on the color filter layer and a lower alignment layer formed on the rear polarizer layer;

wherein the color filter layer including a plurality of sub-pixel region arranged in an array form, and the plurality of sub-pixel regions spaced apart by the black matrix, the sub-pixel regions include: red sub-pixel regions, green sub-pixel regions, and blue sub-pixel regions;

wherein the red sub-pixel region including a first quantum dot resin composition layer provided on the lower substrate and a red photoresist layer provided on the first quantum dot red resin composition layer; the green sub-pixel region including a second quantum dot resin composition layer provided on the lower substrate and a green photoresist layer provided on the second quantum dot resin composition layer;

a transparent organic photoresist is filled in the blue sub-pixel region and between the each of the sub-pixel region as the role of a flat layer and a protective layer;

wherein the array substrate including: an upper substrate, an upper alignment layers formed in the upper substrate of the surface faced to the lower substrate, and an upper polarizer layer formed on the upper substrate wherein the upper polarizer layer is provided on the surface faced to the lower substrate, or provided between the upper substrate and the alignment layer;

wherein the first and the second quantum dot resin composition layer is obtained after curing the quantum dot resin composition and the quantum dot resin composition including surface modified red quantum dots, surface modified green quantum dots, alkali-soluble resins, solvents and dispersants;

wherein the material of the surface modified red quantum dots, surface modified green quantum dots including one or more than one material selected from the material of the II-VI family of semiconductor nano-materials III-V family of semiconductor nano-materials, and IV-VI family of semiconductor nano-materials;

the alkali-soluble resin including styrene-maleic anhydride copolymer or aromatic acid (meth) acrylate half ester;

the solvent including one or more than one material selected from the material of formic acid, acetic acid, chloroform, acetone, butanone, fatty alcohols, ethylene glycol monomethyl ether, ethylene glycol monomethyl ether, ethylene glycol monomethyl ether, ethylene glycol monomethyl ether, diethylene glycol diethyl ether, ethyl acetate, methyl ethyl ketone, methyl isobutyl ketone, ethylene glycol monomethyl ether, γ-butyrolactone, 3-ether acetate propionate, butyl carbitol, butyl carbitol, acetate, propylene glycol monomethyl ether, propylene glycol monomethyl ether acetate, cyclohexane, xylene, and isopropyl alcohol; and the dispersant may be selected from amide-based polymer, modified polyurethane, modified polyacrylate, and silicone surfactant; and wherein the thickness of the first and the second quantum dot resin composition layer is 1 μm-200 μm.

The advantage of this disclosure is as followed: the present disclosure provides a quantum dot display apparatus, the color filter layer includes red sub-pixel region, green sub-pixel region, and the blue sub-pixel region, the red sub-pixel region includes a first quantum dot resin composition layer, and the red photoresist layer, the green sub-pixel region includes a second quantum dot resin composition layer, and the green photoresist layer, the blue sub-pixel region filled with organic transparent photoresist, wherein the first and second quantum dot resin composition layer are mixed with surface modified red quantum dots, and surface modified green quantum dot. By the excitation of the blue light backlight module, the first and second quantum dot resin composition layer emits red and green mixing light with narrow full width at half maximum, the mixing light are followed and filtered by red and green photoresist respectively into monochromatic red and green light. The blue monochromatic light emitted from the blue light backlight module is directly through the transparent organic photoresist, and realize the function of the color filter layer. By adding quantum dot technology, can increase the color saturation and color gamut of the display apparatus, and the structure of the quantum dot display apparatus mentioned above, the manufacture is simple and convenient. The disclosure also provides a manufacturing method of a quantum dot display apparatus, the methods includes exposure, coating, developing process of the existing color filter to contain the surface modified red and green quantum dot resin composition with more sophisticated patterns, and making high resolution, color saturation and color gamut quantum dot display apparatus, the material preparation and fabrication process of this manufacturing method is simple, less waste of materials, low production cost, suitable for mass production.

BRIEF DESCRIPTION OF THE DRAWINGS

The following detailed descriptions accompanying drawings and the embodiment of the present disclosure make the aspect of the present disclosure and the other beneficial effect more obvious.

DETAILED DESCRIPTION OF THE PREFERRED EMBODIMENTS

The specific components or items are used in the specification and claims. Those skilled in the art can use other possible modifications and variations in the same components or items. The specification and claim will not distinguish the different terms to the items or components but by the functions. Following is the detail description illustrated by the figures and the embodiments.

Figure 9:
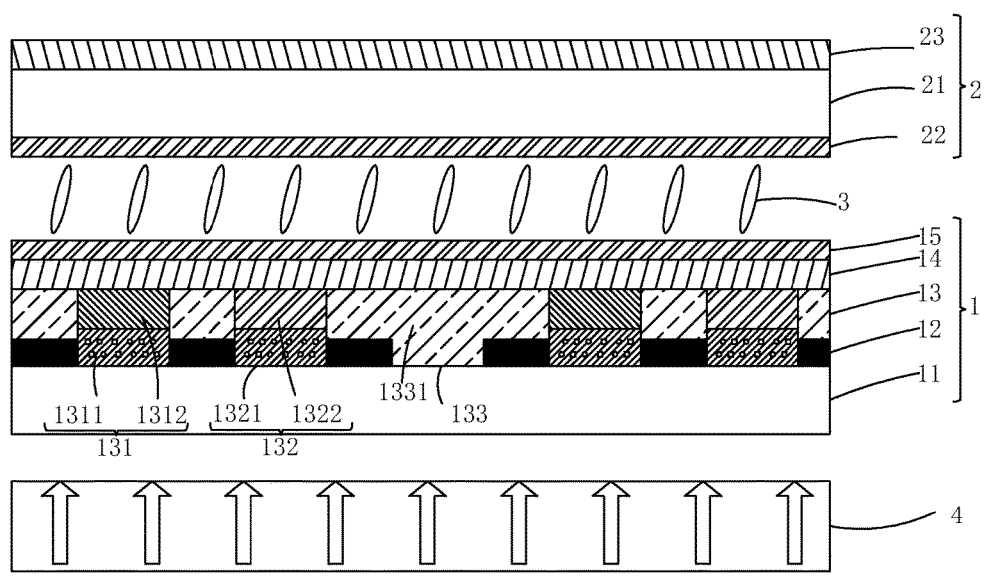
FIG. 9 illustrates the steps 7-8 of the manufacturing method of the quantum dot display apparatus and the schematic view of the quantum dot display apparatus according to the embodiment of the present disclosure.

Referring to FIG. 9, a quantum dot display apparatus is provided in the present disclosure, including a color filter substrate 1, an array substrate 2 formed opposite to the color filter substrate, a blue light backlight module 4 formed under the color filter substrate 1, and the liquid crystal layer 3 formed between the color filter substrate 1 and the array substrate 2.

The color filter substrate 1 includes a lower substrate 11, a color filter layer 13 and a black matrix 12 formed on the lower substrate 11, a rear polarizer layer 14 formed on the color filter layer 13 and a lower alignment layer 15 formed on the rear polarizer layer 14.

The color filter layer 13 includes a plurality of sub-pixel regions arranged in an array form, and the plurality of sub-pixel regions spaced apart by the black matrix 12, the sub-pixel regions include: red sub-pixel regions 131, green sub-pixel regions 132, and blue sub-pixel regions 133.

The red sub-pixel region 131 includes: a first quantum dot resin composition layer 1311 provided on the lower substrate 11, and a red photoresist layer 1312 provided on the first quantum dot red resin composition layer 1311; the green sub-pixel region 132 includes: a second quantum dot resin composition layer 1321 provided on the lower substrate 11, and a green photoresist layer 1322 provided on the second quantum dot resin composition layer 1321.

A transparent organic photoresist 1331 is filled in the blue sub-pixel region 133 and between the each of the sub-pixel region.

Specifically, the array substrate 2 includes: an upper substrate 21, an upper alignment layers 22 formed in the upper substrate 21 of the surface faced to the lower substrate 11, and an upper polarizer layer 23 formed on the upper substrate 21. The upper substrate 21 and lower substrate 11 are transparent substrates, preferably glass substrates. The rear polarizer layer 14 is an embedded dye-based polarizing film, the upper polarizer layer 23 is embedded or externally formed type, that is the upper polarizer layer 23 can be provided on the lower surface of the substrate 21 on one side opposite to the lower substrate 11, it can also be provided between the upper substrate 21 and the alignment layer 22 whose polarization direction is perpendicular to the polarization direction of the polarizing layer 14.

Further, the blue light backlight module 4 emits blue monochromatic light, the blue monochromatic light excites the first and the second quantum dot resin composition layer 1311, 1321 in the red sub-pixel region 131, and the green sub-pixel region 132 to emit a red and a green mixing light, the red and green mixing light is filtered by the red and green photoresist layer 1312, 1322 and emitting red monochromatic light and green monochromatic light 1322. While the transparent organic photoresist 1331 is filled in the blue sub-pixel region 133, the blue monochromatic light blue emitted from the blue light backlight module 4 is directly pass through the transparent organic photoresist 1331 and emits the blue monochromatic light blue; in addition, the transparent organic photoresist 1331 is not only filled in the blue sub-pixel region 133, but also filled between the respective sub-pixel regions, the role of a flat layer and a protective layer.

Specifically, the first and the second quantum dot resin composition layer 1311, 1321 is obtained after curing the quantum dot resin composition. The quantum dot resin composition includes surface modified red quantum dots, surface modified green quantum dots, alkali-soluble resins, solvents and dispersants, by uniformly mixing by percentage of the above composition.

Wherein the material of the surface modified red quantum dots, surface modified green quantum dots includes one or more than one material selected from the material of the II-VI family of semiconductor nano-materials, for example: cadmium sulfide (CdS), cadmium selenide (CdSe), mercury telluride (HgTe), zinc sulfide (ZnS), zinc selenide (ZnSe), zinc telluride (ZnTe), mercury sulfide (HgS), etc., III-V family of semiconductor nano-materials, for example: indium phosphide (InP), indium arsenide (InAs), gallium phosphide (GaP), gallium arsenide (GaAs), etc., and IV-VI family of semiconductor nano-materials. The alkali-soluble resin includes styrene-maleic anhydride copolymer or aromatic acid (meth) acrylate half ester. The solvent includes one or more than one material selected from the material of formic acid, acetic acid, chloroform, acetone, butanone, fatty alcohols, ethylene glycol monomethyl ether, ethylene glycol monomethyl ether, ethylene glycol monomethyl ether, ethylene glycol monomethyl ether, diethylene glycol diethyl ether, ethyl acetate, methyl ethyl ketone, methyl isobutyl ketone, ethylene glycol monomethyl ether, γ-butyrolactone, 3-ether acetate propionate, butyl carbitol, butyl carbitol, acetate, propylene glycol monomethyl ether, propylene glycol monomethyl ether acetate, cyclohexane, xylene, and isopropyl alcohol.

The dispersant may be selected from amide-based polymer, modified polyurethane, modified polyacrylate, and silicone surfactant.

In addition, in order to improve the performance of the quantum dots resin composition, such as improving the levelling property and the developing property etc. of the quantum dots resin composition, other appropriate additive agent be added to the quantum dots resin composition according to the specific use, you may choose not to add the additive agent.

Specifically, the thickness of the first and the second quantum dot resin composition layer 1311, 1321 is 1 μm-200 μm.

Figure 1:
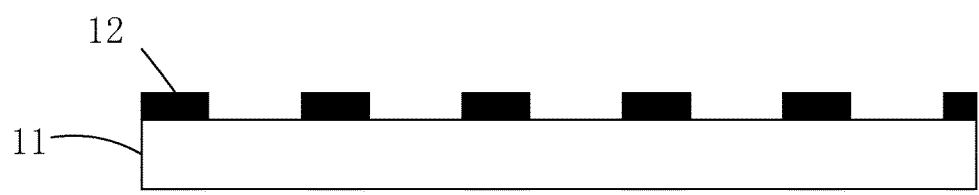
FIG. 1 illustrates the step 1 of the manufacturing method of a quantum dot display apparatus according to the embodiment of the present disclosure.
Figure 10:
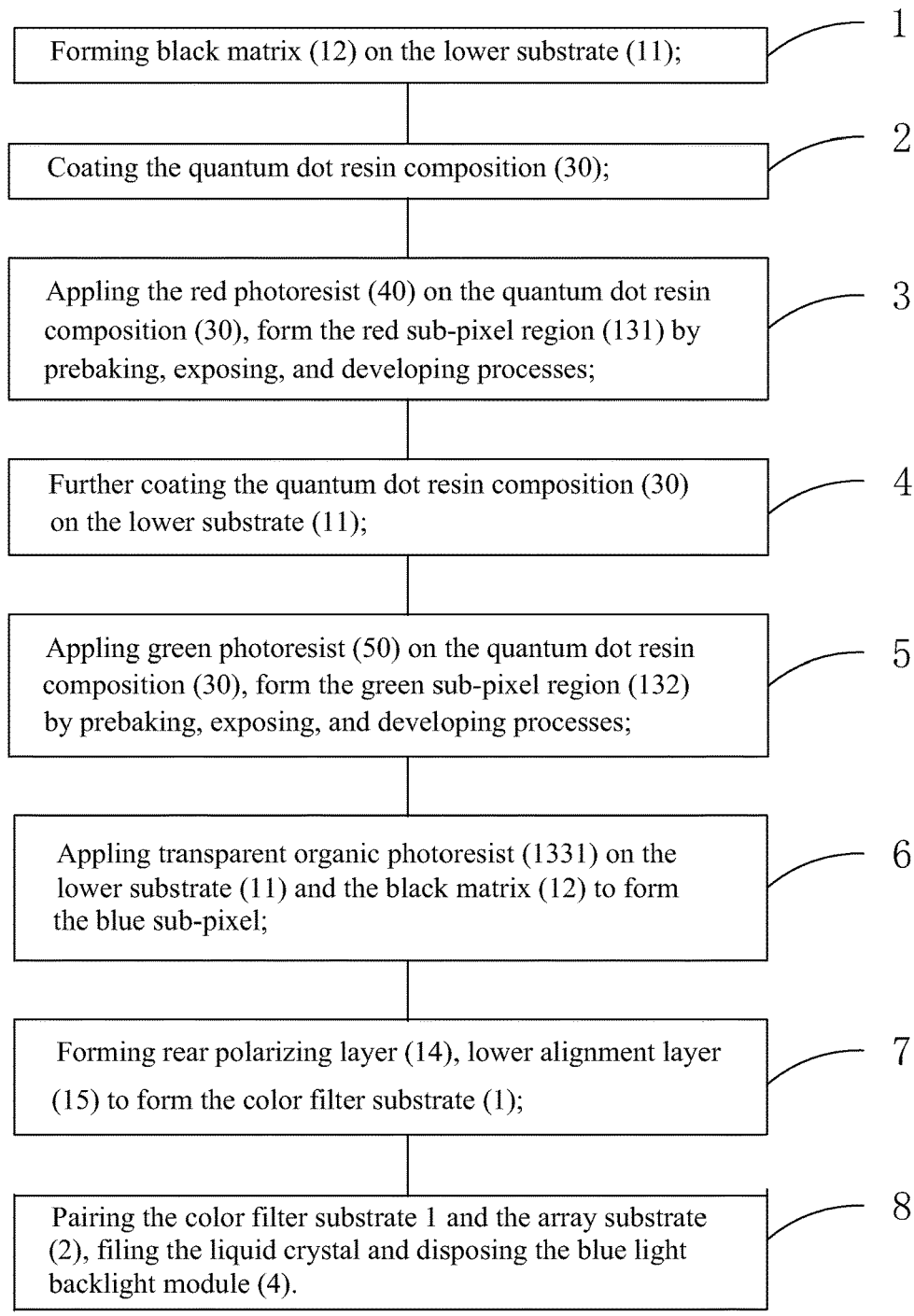
FIG. 10 illustrates the process flow of the manufacturing method of the quantum dot display apparatus according to the embodiment of the present disclosure.

Referring to FIG. 10, a manufacturing method of the quantum dot display apparatus is also provided in present disclosure, including the following steps:

Step 1: referring to FIG. 1, the lower substrate 11 is provided, and the black matrix 12 is formed on the lower substrate 11.

Specifically, the lower substrate 11 is a transparent substrate, preferably a glass substrate, the material of the black matrix 12 is a metallic material or a resin type material.

Figure 2:
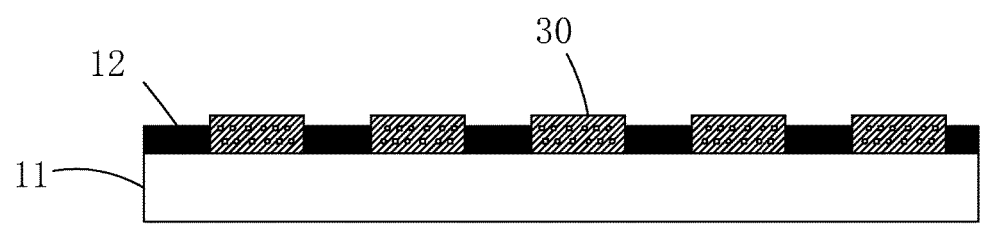
FIG. 2 illustrates the step 2 of the manufacturing method of the quantum dot display apparatus according to the embodiment of the present disclosure.

Step 2, referring to FIG. 2, a quantum dot resin composition 30 is coated on the lower substrate 11 between the black matrix 12, pre-baking the lower substrate 11 coated with the quantum dot resin composition 30 to remove the organic solvent in the quantum dot resin composition 30;

Specifically, the quantum dot resin composition 30 is applied by spin coating or a slit coating method, the thickness of 1 μm-200 μm, the prebaking temperature is 100° C.-150° C.

Specifically, the quantum dot resin composition 30 includes surface modified red quantum dots, surface modified green quantum dots, alkali-soluble resins, solvents and dispersants, by uniformly mixing by percentage of the above composition.

Wherein the material of the surface modified red quantum dots, surface modified green quantum dots includes one or more than one material selected from the material of the II-VI family of semiconductor nano-materials, for example: cadmium sulfide (CdS), cadmium selenide (CdSe), mercury telluride (HgTe), zinc sulfide (ZnS), zinc selenide (ZnSe), zinc telluride (ZnTe), mercury sulfide (HgS), etc., III-V family of semiconductor nano-materials, for example: indium phosphide (InP), indium arsenide (InAs), gallium phosphide (GaP), gallium arsenide (GaAs), etc., and IV-VI family of semiconductor nano-materials.

The alkali-soluble resin includes styrene-maleic anhydride copolymer or aromatic acid (meth) acrylate half ester. The solvent includes one or more than one material selected from the material of formic acid, acetic acid, chloroform, acetone, butanone, fatty alcohols, ethylene glycol monomethyl ether, ethylene glycol monomethyl ether, ethylene glycol monomethyl ether, ethylene glycol monomethyl ether, diethylene glycol diethyl ether, ethyl acetate, methyl ethyl ketone, methyl isobutyl ketone, ethylene glycol monomethyl ether, γ-butyrolactone, 3-ether acetate propionate, butyl carbitol, butyl carbitol, acetate, propylene glycol monomethyl ether, propylene glycol monomethyl ether acetate, cyclohexane, xylene, and isopropyl alcohol.

The dispersant may be selected from amide-based polymer, modified polyurethane, modified polyacrylate, and silicone surfactant.

In addition, in order to improve the performance of the quantum dots resin composition, such as improving the levelling property and the developing property etc. of the quantum dots resin composition, other appropriate additive agent be added to the quantum dots resin composition according to the specific use, you may choose not to add the additive agent.

Step 3, referring to FIGS. 3-4, a red photoresist 40 is applied on the quantum dot resin composition 30 and the black matrix 12, the excess red photoresist 40 and the quantum dot resin composition 30 are removed by prebaking, exposing, and developing processes to bake and form the red sub-pixel region 131 including the red photoresist layer 1312 and the first quantum dot resin composition layer 1311 disposed below the red photoresist layer 1312.

Figure 3:
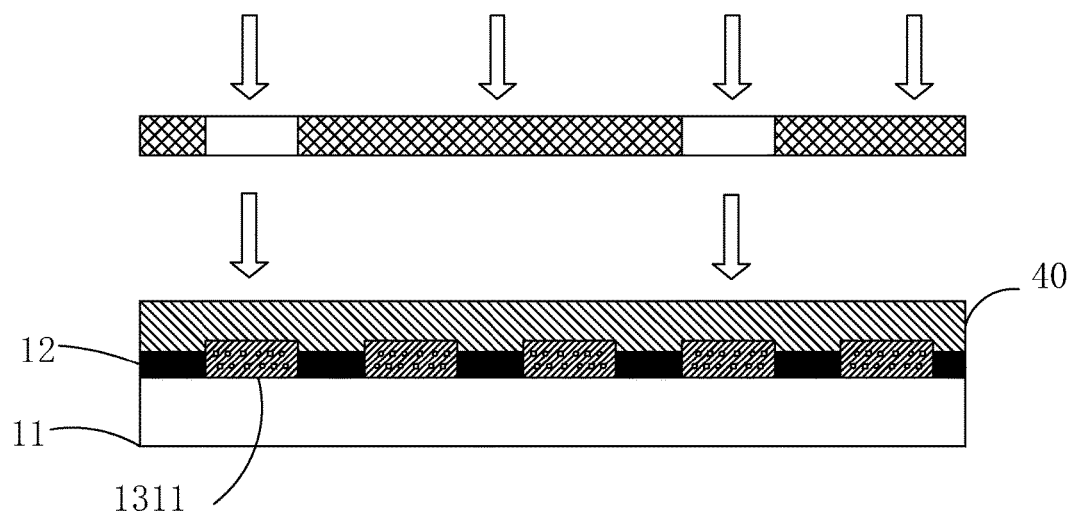
FIGS. 3-4 illustrate the step 3 of the manufacturing method of the quantum dot display apparatus according to the embodiment of the present disclosure.
Figure 4:
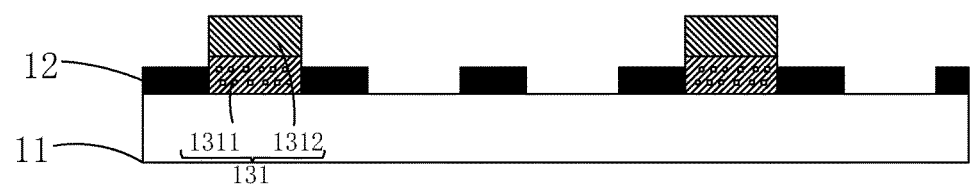

As illustrated in FIG. 3, the red photoresist and the quantum dot resin composition in the red sub-pixel region 131 are irradiated by the UV light so that the monomers in the red photoresist 40 is performing polymerization reaction under the action of the photoinitiator, whereby not be washed away by the developer during the development to form a red sub-pixel region 131; the monomers in the red photoresist 40 not irradiated by the UV light are not performing polymerization reaction under the action of the photoinitiator. Therefore the red photoresist 40 and the quantum dot resin composition 30 are washed away by the developer during the development, based on the principle described above by the corresponding mask to control the UV light irradiation area to realize the process of forming the red sub-pixel region 131.

Figure 5:
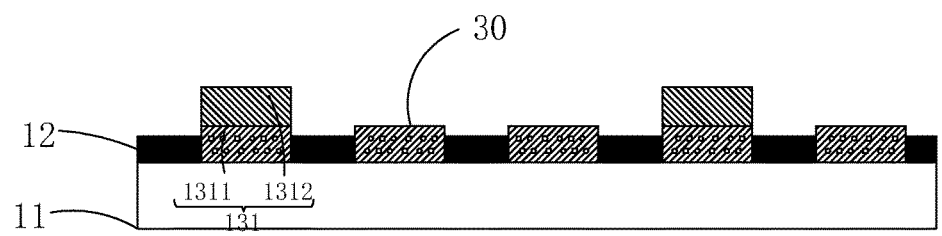
FIG. 5 illustrates the step 4 of the manufacturing method of the quantum dot display apparatus according to the embodiment of the present disclosure.

Step 4, referring to FIG. 5, the quantum dot resin composition 30 is further coated between the black matrix on the lower substrate 12, pre-baking the lower substrate 11 coated with the quantum dot resin composition 30 to remove the organic solvent in the quantum dot resin composition 30.

Figure 6:
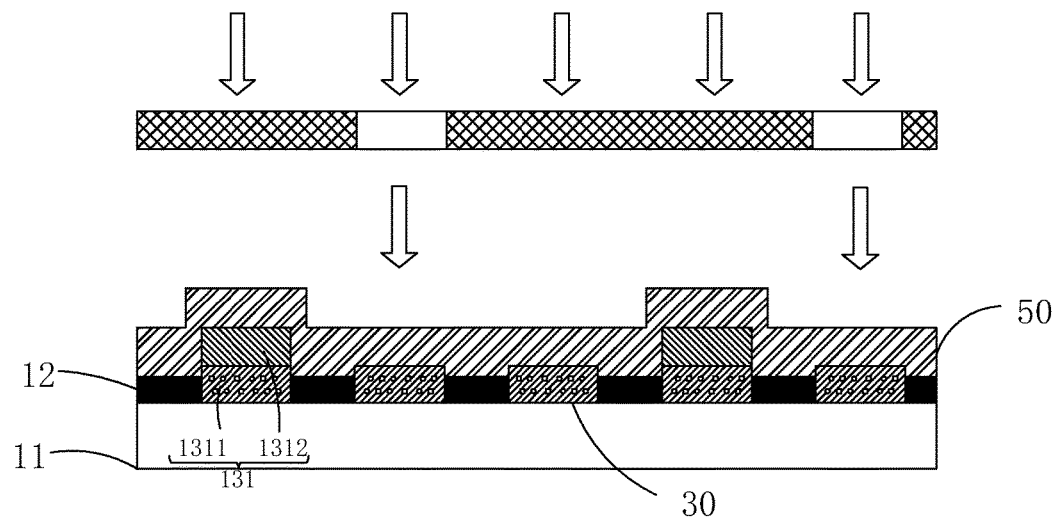
FIGS. 6-7 illustrate the step 5 of the manufacturing method of the quantum dot display apparatus according to the embodiment of the present disclosure.
Figure 7:
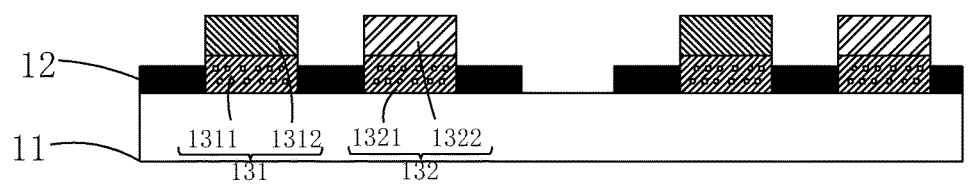

Step 5, referring to FIGS. 6-7, a green photoresist 50 is applied on the quantum dot resin composition 30 and the black matrix 12, the excess green photoresist 50 and the quantum dot resin composition 30 are removed by prebaking, exposing, and developing processes to bake and form the green sub-pixel region 132 including the green photoresist layer 1322 and the second quantum dot resin composition layer 1321 disposed below the green photoresist layer 1322.

Figure 8:
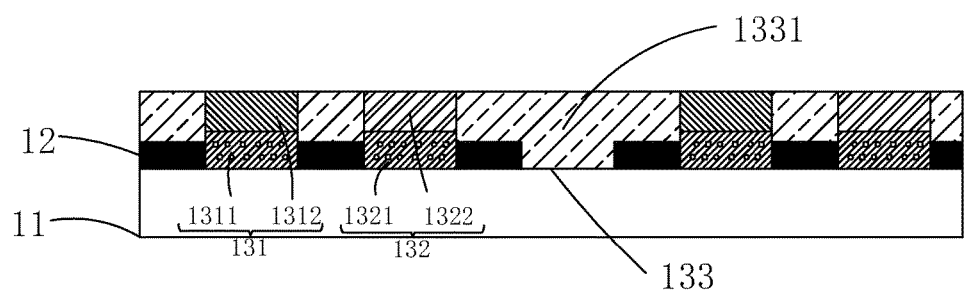
FIG. 8 illustrates the step 6 of the manufacturing method of the quantum dot display apparatus according to the embodiment of the present disclosure.

Step 6, referring to FIG. 8, the transparent organic photoresist 1331 is coated on the lower substrate 11 and the black matrix to form the blue sub-pixel region 133, thus forming a color filter layer 13.

The transparent organic photoresist 1331 is not only filled in the blue sub-pixel region 133, but also filled between the respective sub-pixel regions, the role of a flat layer and a protective layer.

Step 7, referring to FIG. 9, the rear polarizing layer 14 is set on the color filter layer 13, the lower alignment layer 15 is formed on the polarizing layer 14, to finish the formation of a color filter substrate 1.

In particular, the rear polarizing layer 14 is a built-in polarizer, preferably dye-based polarizer.

Step 8, the array substrate 1 is provided, and the color filter substrate 2 and the array substrate 2 are paired, the liquid crystal is filled to form the liquid crystal layer 3, the blue light backlight module 4 is disposed in a bottom of the color filter substrate 1 to produce the quantum dot display apparatus.

Specifically, the array substrate 2 includes: an upper substrate 21, an upper alignment layers 22 formed in the upper substrate 21 of the surface faced to the lower substrate 11, and an upper polarizer layer 23 formed on the upper substrate 21. The upper polarizer layer 23 is embedded or externally formed type, that is the upper polarizer layer 23 can be provided on the lower surface of the substrate 21 on one side opposite to the lower substrate 11, it can also be provided between the upper substrate 21 and the alignment layer 22 whose polarization direction is perpendicular to the polarization direction of the polarizing layer 14.

The blue light backlight module 4 emits blue monochromatic light, the blue monochromatic light excites the first and the second quantum dot resin composition layer 1311, 1321 in the red sub-pixel region 131, and the green sub-pixel region 132 to emit a red and a green mixing light, the red and green mixing light is filtered by the red and green photoresist layer 1312, 1322 and emitting red monochromatic light and green monochromatic light 1322. While the transparent organic photoresist 1331 is filled in the blue sub-pixel region 133, the blue monochromatic light blue emitted from the blue light backlight module 4 is directly pass through the transparent organic photoresist 1331 and emits the blue monochromatic light blue.

In summary, the present disclosure provides a quantum dot display apparatus, the color filter layer includes red sub-pixel region, green sub-pixel region, and the blue sub-pixel region, the red sub-pixel region includes a first quantum dot resin composition layer, and the red photoresist layer, the green sub-pixel region includes a second quantum dot resin composition layer, and the green photoresist layer, the blue sub-pixel region filled with organic transparent photoresist, wherein the first and second quantum dot resin composition layer are mixed with surface modified red quantum dots, and surface modified green quantum dot. By the excitation of the blue light backlight module, the first and second quantum dot resin composition layer emits red and green mixing light with narrow full width at half maximum, the mixing light are followed and filtered by red and green photoresist respectively into monochromatic red and green light. The blue monochromatic light emitted from the blue light backlight module is directly through the transparent organic photoresist, and realize the function of the color filter layer. By adding quantum dot technology, can increase the color saturation and color gamut of the display apparatus, and the structure of the quantum dot display apparatus mentioned above, the manufacture is simple and convenient. The disclosure also provides a manufacturing method of a quantum dot display apparatus, the methods includes exposure, coating, developing process of the existing color filter to contain the surface modified red and green quantum dot resin composition with more sophisticated patterns, and making high resolution, color saturation and color gamut quantum dot display apparatus, the material preparation and fabrication process of this manufacturing method is simple, less waste of materials, low production cost, suitable for mass production.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

Although the drawings and the illustrations above are corresponding to the specific embodiments individually, the element, the practicing method, the designing principle, and the technical theory can be referred, exchanged, incorporated, collocated, coordinated except they are conflicted, incompatible, or hard to be put into practice together.

Although the present disclosure has been explained above, it is not the limitation of the range, the sequence in practice, the material in practice, or the method in practice. Any modification or decoration for present disclosure is not detached from the spirit and the range of such.

What is claimed is:

1. A manufacturing method of a quantum dot display apparatus, comprising the following steps:

Step 1: a lower substrate is provided, and a black matrix is formed on the lower substrate;

Step 2: a quantum dot resin composition is coated on the lower substrate between the black matrix, pre-baking the lower substrate coated with the quantum dot resin composition to remove an organic solvent in the quantum dot resin composition;

Step 3: a red photoresist is applied on the quantum dot resin composition and the black matrix, excess red photoresist and excess quantum dot resin composition are removed by prebaking, exposing, and developing processes to bake and form a red sub-pixel region comprising a red photoresist layer and a first quantum dot resin composition layer disposed below the red photoresist layer;

Step 4: the quantum dot resin composition is further coated between the black matrix on the lower substrate, pre-baking the lower substrate coated with the quantum dot resin composition to remove the organic solvent in the quantum dot resin composition;

Step 5: a green photoresist is applied on the quantum dot resin composition and the black matrix, excess green photoresist and excess quantum dot resin composition are removed by prebaking, exposing, and developing processes to bake and form a green sub-pixel region comprising a green photoresist layer and a second quantum dot resin composition layer disposed below the green photoresist layer;

Step 6: a transparent organic photoresist is coated on the lower substrate and the black matrix to form a blue sub-pixel region, thus forming a color filter layer;

Step 7: a rear polarizing layer is set on the color filter layer, a lower alignment layer is formed on the polarizing layer, to finish the formation of a color filter substrate; and Step 8: an array substrate is provided, and the color filter substrate and the array substrate are paired, a liquid crystal is filled to form a liquid crystal layer, a blue light backlight module is disposed in a bottom of the color filter substrate to produce the quantum dot display apparatus;

wherein in the steps 2 and 4, the quantum dot resin composition comprising surface modified red quantum dots, surface modified green quantum dots, alkali-soluble resins, solvents and dispersants;

wherein the material of the surface modified red quantum dots, surface modified green quantum dots comprising one or more than one material selected from the material of the II-VI family of semiconductor nano-materials, III-V family of semiconductor nano-materials, and IV-VI family of semiconductor nano-materials;

the alkali-soluble resin comprising styrene-maleic anhydride copolymer or aromatic acid (meth) acrylate half ester;

the solvent comprising one or more than one material selected from the material of formic acid, acetic acid, chloroform, acetone, butanone, fatty alcohols, ethylene glycol monomethyl ether, ethylene glycol monomethyl ether, ethylene glycol monomethyl ether, ethylene glycol monomethyl ether, diethylene glycol diethyl ether, ethyl acetate, methyl ethyl ketone, methyl isobutyl ketone, ethylene glycol monomethyl ether, γ-butyrolactone, 3-ether acetate propionate, butyl carbitol, butyl carbitol, acetate, propylene glycol monomethyl ether, propylene glycol monomethyl ether acetate, cyclohexane, xylene, and isopropyl alcohol; and the dispersant may be selected from amide-based polymer, modified polyurethane, modified polyacrylate, and silicone surfactant.

2. The manufacturing method of a quantum dot display apparatus according to claim 1, wherein in the steps 2 and 4 the thickness of the first and the second quantum dot resin composition layer is 1 μm-200 μm and the prebaking temperature is 100° C. –150° C.

3. The manufacturing method of a quantum dot display apparatus according to claim 1, wherein the array substrate comprising: an upper substrate, an upper alignment layer formed in the upper substrate of the surface faced to the lower substrate, and an upper polarizer layer formed on the upper substrate wherein the upper polarizer layer is provided on the surface faced to the lower substrate, or provided between the upper substrate and the upper alignment layer.

* * * * *